United States Patent
Sato

(10) Patent No.: US 8,866,346 B2
(45) Date of Patent: Oct. 21, 2014

(54) CIRCUIT DEVICE, ELECTRONIC APPARATUS AND POWER SUPPLY CIRCUIT

(75) Inventor: Hisao Sato, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 742 days.

(21) Appl. No.: 13/041,925

(22) Filed: Mar. 7, 2011

(65) Prior Publication Data

US 2011/0227419 A1  Sep. 22, 2011

(30) Foreign Application Priority Data

Mar. 17, 2010 (JP) .................. 2010-061146

(51) Int. Cl.
- *H01F 27/42* (2006.01)
- *H03H 7/09* (2006.01)
- *H03H 7/01* (2006.01)
- *H03H 1/00* (2006.01)

(52) U.S. Cl.
CPC ............... *H03H 7/0115* (2013.01); *H03H 7/09* (2013.01); *H03H 2001/0057* (2013.01)
USPC ........................................................ 307/104

(58) Field of Classification Search
USPC ........................................................ 307/104
See application file for complete search history.

(56) References Cited

U.S. PATENT DOCUMENTS

| | | | |
|---|---|---|---|
| 3,827,592 A | 8/1974 | Deussen | |
| 5,083,101 A * | 1/1992 | Frederick | ............. 333/181 |
| 5,701,093 A | 12/1997 | Suzuki | |
| 6,542,002 B2 | 4/2003 | Jang et al. | |
| 7,589,605 B2 * | 9/2009 | Perreault et al. | ........ 333/177 |
| 7,595,687 B2 * | 9/2009 | Mortensen et al. | ........ 327/551 |
| 2002/0158660 A1 | 10/2002 | Jang et al. | |
| 2008/0082152 A1 * | 4/2008 | Gong et al. | ........ 607/115 |

FOREIGN PATENT DOCUMENTS

| | | |
|---|---|---|
| JP | 08-316823 | 11/1996 |
| JP | 2002-325031 | 11/2002 |
| JP | 2006-109617 | 4/2006 |
| JP | 2006-345642 | 12/2006 |
| JP | 2009-278433 | 11/2009 |

* cited by examiner

*Primary Examiner* — Jared Fureman
*Assistant Examiner* — Duc M Pham

(57) ABSTRACT

A circuit device includes a power supply circuit having a resonance circuit, and a logic circuit. The resonance circuit includes a first coil, and a second coil having a core section shared by the first coil. The logic circuit performs an adiabatic circuit operation with a power supply voltage generated by the resonance circuit.

15 Claims, 12 Drawing Sheets

CIRCUIT DEVICE, ELECTRONIC APPARATUS AND POWER SUPPLY CIRCUIT

Priority is claimed on Japanese Patent Application No. 2010-061146, filed Mar. 17, 2010, the content of which is incorporated herein by reference.

BACKGROUND

1. Technical Field

The invention relates to circuit devices, electronic apparatuses and power supply circuits.

2. Related Art

Adiabatic logic circuits are known as a technology to suppress power consumption of logic circuits (for example, the technology described in JP-A-2002-325031). The adiabatic logic circuit suppresses power consumption, which may be caused by the drain loss of transistors, by changing the power supply voltage. Also, a adiabatic logic circuit formed from CMOS static logic gates without using diodes, and a switched capacitor circuit that generates power supply clocks (for example, the technology described in JP-A-2009-278433) are known.

When diodes are used in an adiabatic logic circuit, the power consumed by the diodes cannot be ignored. While power supply voltages have been lowered due to the progress in miniaturization of semiconductor manufacturing process, voltage drops caused by diodes lower the voltage level of signals, and deteriorate the degree of noise margin. In this respect, the adiabatic circuit system without using diodes, described in JP-A-2009-278433, has been proposed.

However, when the power supply circuit that supplies power supply voltages to the adiabatic logic circuit does not perform power regeneration, the power consumption cannot be sufficiently suppressed. In other words, the energy of charges returned to the power supply circuit from the adiabatic logic circuit is consumed without being regenerated at the power supply circuit, whereby the power consumption in the power supply circuit increases.

In this connection, the inventor of the present application has developed a technique that uses a resonant circuit formed with two independent coils and a capacitor as a power supply circuit, and performs power regeneration by the resonance circuit, as will be described below with reference to a comparison example.

However, this technique requires two coils as parts externally installed to the power supply LSI, and thus entails a problem in that the mounting area increases. For example, to maintain the resonance against power loss in the adiabatic logic circuit, it is necessary to have two coils with high Q value which occupy about the same mounting area as that of the LSI and the like formed from the logic circuit including the power supply circuit.

SUMMARY

In accordance with an advantage of some aspects of the invention, circuit devices, electronic apparatuses, power supply circuits and the like which can reduce their mounting area are provided.

An embodiment of the invention pertains to a circuit device that includes a power supply circuit having a resonance circuit and a logic circuit. The resonance circuit includes a first coil, and a second coil having a core section shared by the first coil, and the logic circuit performs an adiabatic circuit operation, as it is supplied with a power supply voltage generated by the resonance circuit.

According to the above-described embodiment of the invention, the resonance circuit having the first coil and the second coil that share the core section generates a power supply voltage, and the power supply voltage is supplied to the logic circuit by which the adiabatic circuit operation is performed. This makes it possible to achieve a reduction in the mounting area of the circuit device.

Also, according to an aspect of the embodiment of the invention, the core section may have a columnar section, the first coil may be formed from a first winding wound on the columnar section, and the second coil may be formed from a second winding wound on the columnar section.

In this manner, the first winding and the second winding are wound on the columnar section of the core section, such that the first coil and the second coil can share the core section.

Also, according to an aspect of the embodiment of the invention, the resonance circuit may include a coil section having the first coil, the second coil and the core section, and a capacitor provided between a node on one end side of the first coil and a node on one end side of the second coil.

In this manner, the resonance circuit can be formed from the first coil and the second coil that share the core section, and the capacitor.

In an aspect of the embodiment of the invention, the core section may have one core, and the first coil and the second coil can share the one core.

In this manner, the first coil and the second coil can share a single core as the core section. However, in accordance with another aspect of the embodiment of the invention, the core section may include a plurality of cores, and the first coil and the second coil may share a core section formed from the plurality of cores combined.

In accordance with an aspect of the embodiment of the invention, the power supply circuit may supply a first power supply voltage from the node on the one end side of the first coil and a second power supply voltage from the node on the one end side of the second coil to the logic circuit as the power supply voltage, and the logic circuit may perform the adiabatic circuit operation with the first power supply voltage and the second power supply voltage being supplied.

In doing so, the first power supply voltage can be supplied from the node on the one end side of the first coil, and the second power supply voltage from the node on the one end of the second coil.

Also, in accordance with another aspect of the embodiment of the invention, the first power supply voltage supplied by the power supply circuit may periodically change with a first reference voltage as a reference voltage, and the second power supply voltage supplied by the power supply circuit may periodically change with a second reference voltage as a reference voltage, and the power supply circuit may supply, by the resonance circuit, the first power supply voltage and the second power supply voltage that repeat a first period in which a voltage difference between the first power supply voltage and the second power supply voltage becomes smaller and a second period in which the voltage difference becomes greater.

Further, in an aspect of the embodiment of the invention, the second power supply voltage may assume a maximum value in a period between a first maximum value of the first power supply voltage and a second maximum value succeeding the first maximum value, and may assume a minimum value in a period between a first minimum value of the first power supply voltage and a second minimum value succeeding the first minimum value.

In doing so, the first power supply voltage and the second power supply voltage that periodically repeat the first period with a decreasing voltage difference and the second period with an increasing voltage difference are supplied by resonance. Also, the second power supply voltage that assumes a maximum value in a period between maximum values of the first power supply voltage, and assumes a minimum value in a period between minimum values of the first power supply voltage is supplied by resonance. By this, power regeneration and the like becomes possible by the resonance circuit.

Also, in an aspect of the embodiment of the invention, an input signal having an edge in the second period may be inputted in the logic circuit.

By inputting an input signal having an edge in the second period in which the voltage difference between the first power supply voltage and the second power supply voltage becomes greater, the logic circuit can perform an adiabatic circuit operation.

Also, in an aspect of the embodiment of the invention, the first power supply voltage provided by the power supply circuit may be a sine wave with a first reference voltage as a reference voltage, and the second power supply voltage provided by the power supply circuit may be a sine wave with an opposite phase with respect to that of the first power supply voltage with a second reference voltage as a reference voltage.

In doing so, the first power supply voltage and the second power supply voltage that repeat the first period in which the voltage difference becomes smaller and the second period in which the voltage difference becomes greater can be supplied.

Also, in an aspect of the embodiment of the invention, the first reference voltage and the second reference voltage may be mutually different reference voltages.

In doing so, the first power supply voltage and the second power supply voltage that periodically change with different reference voltages as reference voltages can be supplied to the logic circuit.

Furthermore, in an aspect of the embodiment of the invention, the power supply circuit may supply a first power supply voltage from the node on the one end side of the first coil and a second power supply voltage from the node on the one end side of the second coil to the logic circuit as the power supply voltage, and a transistor for oscillation continuation may be provided at the node on the one end side of the second coil.

In doing so, the transistor for oscillation continuation is provided at the node on the one end side of the second coil, so that oscillation continuation of the resonance circuit can be controlled.

Also, in an aspect of the embodiment of the invention, a first reference voltage may be supplied to a node on the other end side of the first coil, a second reference voltage may be supplied to a node on the other end side of the second coil, and the second reference voltage may be a lower voltage than the first reference voltage.

In doing so, the transistor for oscillation continuation may be provided at the node on the other end side of the second coil to which the second reference voltage lower than the first reference voltage is supplied.

Moreover, in an aspect of the embodiment of the invention, the first power supply voltage supplied by the power supply circuit may periodically change with the first reference voltage as a reference voltage, the second power supply voltage supplied by the power supply circuit may periodically change with the second reference voltage as a reference voltage, and a pulse voltage with a period that is n times (n is an integer of 1 or more) the period of the first power supply voltage and the second power supply voltage may be inputted in the gate electrode of the transistor for oscillation continuation.

In doing so, the pulse voltage with a period that is n times the period of the first power supply voltage and the second power supply voltage is inputted in the gate electrode of the transistor for oscillation continuation, by which oscillation continuation of the resonance circuit can be controlled.

Furthermore, another embodiment of the invention pertains to an electronic apparatus that includes any one of the circuit devices described above.

Also, a still another embodiment of the invention pertains to a power supply circuit including a resonance circuit having a coil section and a capacitor. In an aspect, the coil section includes a first coil, and a second coil having a core that is shared by the first coil, and the resonance circuit supplies a power supply voltage by resonance of the coil section and the capacitor.

DESCRIPTION OF EXEMPLARY EMBODIMENTS

Preferred embodiments of the invention are described in detail below. It should be understood, however, that the embodiments described below shall not unduly limit the contents of the invention described in the scope of the claimed invention, and all of the compositions described in the embodiments would not necessarily be indispensable as means for solution of the invention.

1. Comparison Example

In accordance with an embodiment of the invention, a power supply circuit supplies a power supply voltage to an adiabatic logic circuit, and the power supply circuit performs power regeneration by a resonance circuit (for example, a power supply circuit 100 to be described below with reference to FIG. 7). In this case, if the power is regenerated by a resonance circuit formed from two coils and a capacitor, as described above, there is a problem in that the mounting area increases due to the two coils. This problem is described, using an example for comparison with an embodiment of the invention, as shown in FIG. 1 and FIG. 2.

Figure 1:
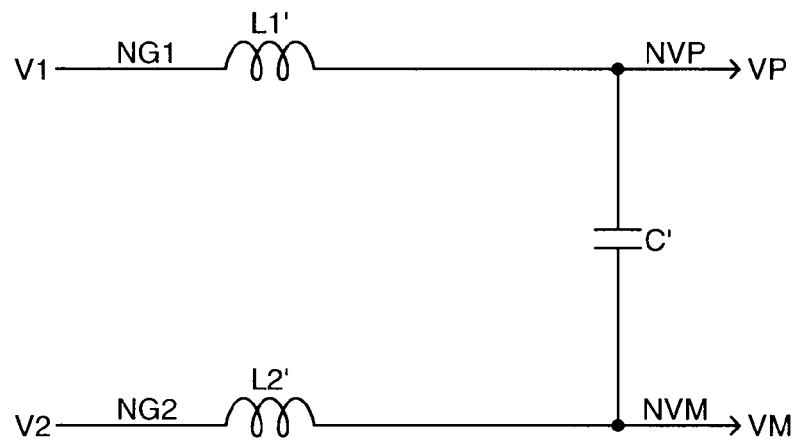
FIG. 1 shows a comparison example of a resonance circuit.
Figure 9:
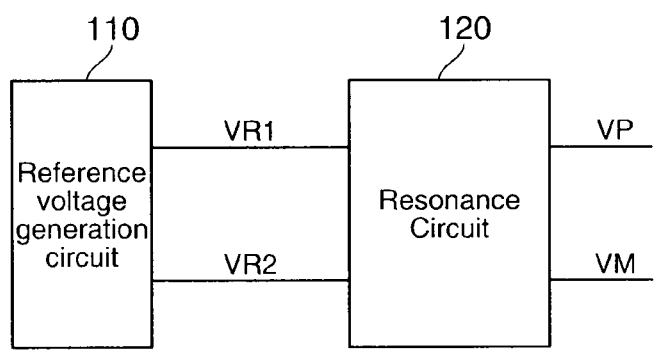
FIG. 9 is a detailed exemplary structure of a power supply circuit.
Figure 10:
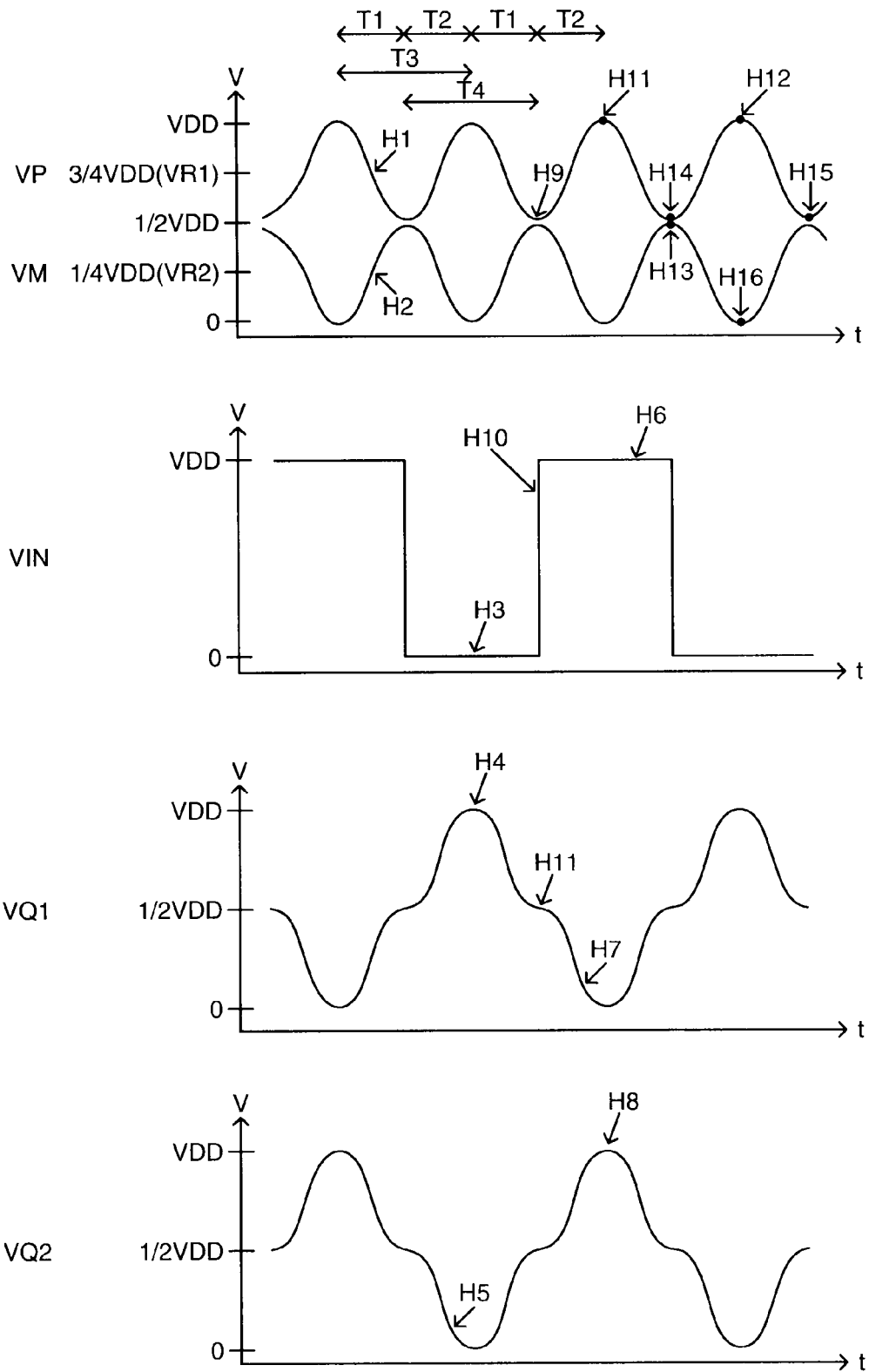
FIG. 10 shows examples of voltage waveforms in accordance with an embodiment of the invention.

FIG. 1 shows a comparison example of a resonance circuit that is used in a power supply circuit. The resonance circuit includes coils L1' and L2' (inductors), and a capacitor C'. The resonance circuit outputs power supply voltages VP and VM of sine waves having opposite phases from nodes NVP and NVM at both terminal ends of the capacitor C1'. For example, when this resonance circuit is applied to a resonance circuit 120 shown in FIG. 9, power supply voltages VP and VM shown in FIG. 10 are outputted.

Figure 2:
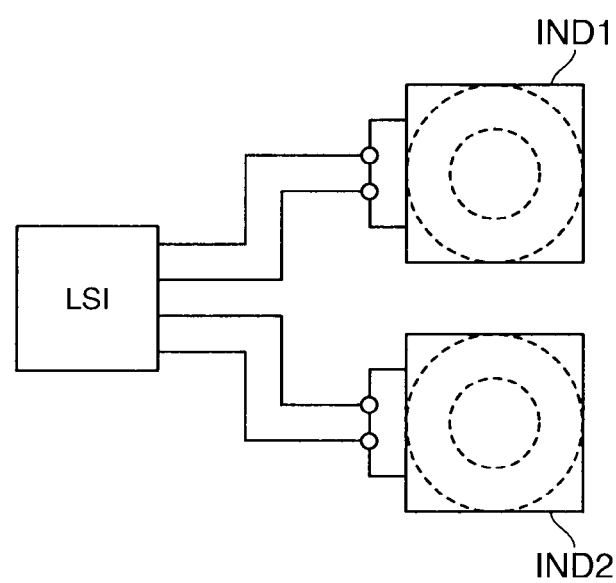
FIG. 2 shows a mounting example of a power supply circuit that includes the resonance circuit of the comparison example.

FIG. 2 shows a mounting example of a power supply circuit that includes the resonance circuit of the comparison example described above. As shown in FIG. 2, a power supply circuit LSI (an integrated circuit device integrating a power supply circuit and the like, in a broader sense) and coils IND1 and IND2 are mounted on a circuit substrate. The power supply circuit LSI includes, for example, the capacitor C' of the resonance circuit, a reference voltage generation circuit, an oscillation control circuit, and a logic circuit. The coils IND1 and IND2 are externally mounted parts corresponding to the above-described coils L1' and L2', and may be formed from, for example, ferrite cores and windings.

In this manner, the two coils IND1 and IND2 need to be mounted on the above-described comparison example, which causes a problem in that the mounting area is increased by the coils IND1 and IND2. For example, when the coils IND1 and IND2 have low Q values, a large power is needed for maintaining the resonance, which fails to accomplish the purpose of achieving a power saving implementation. For this reason, it is necessary to use a coil with a high Q value which uses a winding having a large cross section to reduce the internal resistance, and therefore the mounting area of the coils IND1 and IND2 would increase due to the increase in cross section of the winding. For example, in the case of a power supply circuit with an adiabatic logic circuit, each of the coils IND1 and IND2 would have a larger mounting area than that of the power supply circuit LSI.

2. Exemplary Structure of Embodiment

Figure 3:
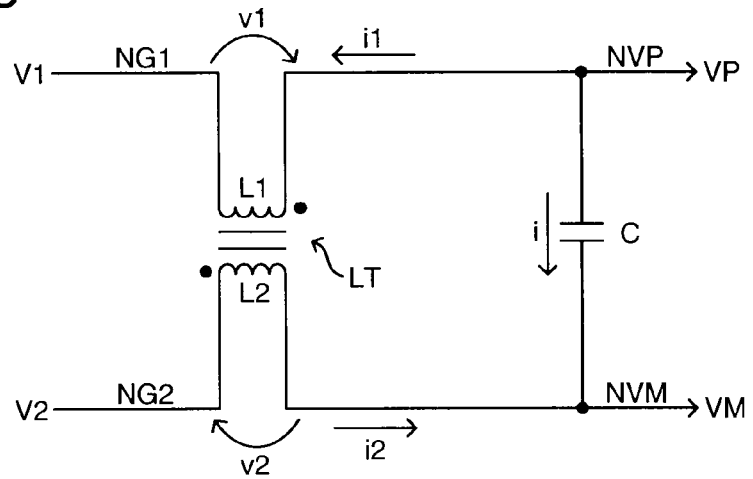
FIG. 3 shows an exemplary structure of a resonance circuit in accordance with an embodiment of the invention.
Figure 4:
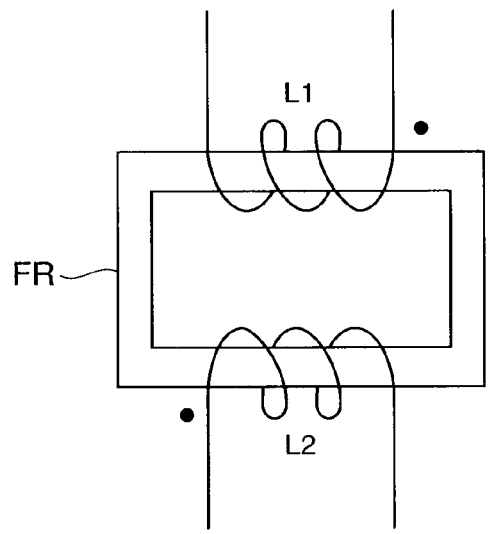
FIG. 4 is a view for explaining wound directions of windings.
Figure 5:
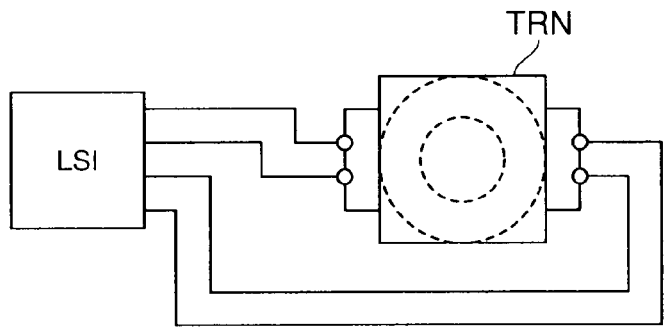
FIG. 5 is a mounting example of a power supply circuit in accordance with an embodiment of the invention.

According to the present embodiment, the mounting area of the power supply circuit is reduced by forming a resonance circuit using coils with mutual inductance. With reference to FIGS. 3-5, an exemplary structure of the present embodiment is described below.

FIG. 3 shows an exemplary structure of a resonance circuit in accordance with the present embodiment. The resonance circuit includes a transformer LT (coils with mutual inductance, in a broad sense), and a capacitor C. The transformer LT includes a first coil L1 (a primary coil, or a first inductor), and a second coil L2 (a secondary coil, or a second inductor). The resonance circuit may be applied to a resonance circuit 120 of a power supply circuit to be described below with reference to FIG. 9 below. It is noted that, the coils L1 and L2 are called transformers LT for the sake of convenience. However, in the present embodiment, the coils L1 and L2 do not necessarily be transformers, and the coils L1 and L2 may only require mutual inductance therebetween.

As shown in FIG. 3, the coil L1 is provided between a node NG1 and a node NVP, and the coil L2 is provided between a node NG2 and a node NVM. The capacitor C is provided between the node NVP and the node NVM. The resonance circuit outputs a first power supply voltage VP from the node NVP and a second power supply voltage VM from the node NVM through resonance generated by the coils L1 and L2 and the capacitor C. For example, as described with reference to FIG. 10, etc., the power supply voltages VP and VM have different reference voltages with sine waves in opposite polarities. Further, as described below with reference to FIG. 7, etc., the power supply voltages VP and VM are used as power supply voltages VP and VM for an adiabatic logic circuit.

It is noted here that dots appended to the coils L1 and L2 represent polarities of the coils. As shown in FIG. 4, the coils L1 and L2 commonly share a core FR (a core section or a magnetic core, in a broad sense). The directions of currents flowing through terminals of the two coils appended with the dots are directions in which magnetic fluxes of the two coils are added up.

FIG. 5 shows an implementation example of a circuit device in accordance with an embodiment that includes the resonance circuit described above. As shown in FIG. 5, in accordance with the present embodiment, a power supply circuit LSI (an integrated circuit device integrating a power supply circuit and the like thereon, in a broad sense) and a transformer TRN are mounted on a circuit substrate. The power supply circuit LSI includes the capacitor C of the resonance circuit, a reference voltage generation circuit that supplies a reference voltage to the nodes NG1 and NG2, an oscillation control circuit that controls oscillation and oscillation amplitude of the power supply circuit, and an adiabatic logic circuit. The transformer TRN is an externally mounting component that corresponds to the transformer LT described above, and may be formed from, for example, a ferrite core and two windings.

In this manner, in the resonance circuit of the present embodiment, two independent coils are substituted by a transformer, such that the externally mounting components can be reduced to only one transformer TRN. Accordingly, the mounting area can be reduced, compared to the comparison example in which the two coils IND1 and IND2 are mounted, as shown in FIG. 2, etc.

The present embodiment is different from the above-described comparison example in that mutual inductance is present between the two coils. In accordance with the present embodiment, the mutual inductance is utilized, so that the volume of the transformer TRN can be made generally equal to the volume of one of the coils IND1 and IND2. This feature is described more specifically.

First, resonance frequency and Q value of the resonance circuit of the present embodiment are obtained. As shown in FIG. 3, it is assumed that the coils L1 and L2 generate electromotive force v1 and v2 and current i1 and i2, respectively, and have resistance value r1 and r2, inductance L1 and L2, and mutual inductance M. Also, it is assumed that the capacitor C generates a current i, and has capacitance C. The nodes NG1 and NG2 are at voltage V1 and V2, respectively. In this case, the following equations (1)-(3) can be established. Here, in the following equations (2) and (3), i=−i1=−i2 is used for equation modification.

[Equation 1]

$$V1 + v1 - \frac{1}{C}\int i\,dt + v2 = V2 \qquad (1)$$

[Equation 2]

$$v1 = L1\frac{di1}{dt} + M\frac{di2}{dt} + r1i1 = -(L1+M)\frac{di}{dt} - r1i \qquad (2)$$

[Equation 3]

$$v2 = M\frac{di1}{dt} + L2\frac{di2}{dt} + r2\,i2 = -(M+L2)\frac{di}{dt} - r2\,i \quad (3)$$

The equations (2) and (3) are substituted for the equation (1) to delete v1 and v2, differentiated once by time t and rearranged, thereby giving an equation (4) shown below. The equation (4) is an equation of vibration, and the resonance frequency of the vibration ω0 (resonance angular frequency) is expressed by an equation (5) shown below, and the Q value Q is expressed by an equation (6) shown below. Here, in the equations (5) and (6), it is assumed that L=L1+L2=2M, and r=r1+r2. In the following description, an example in which no magnetic flux leakage occurs in mutual inductance, and the relation L=L1+L2=2M is established will be described. However, the present embodiment is not limited to cases with absolutely no magnetic flux leakage, as will be described below.

[Equation 4]

$$(L1 + L2 + M)\frac{d^2 i}{dt^2} + (r1 + r2)\frac{di}{dt} + \frac{1}{C}i = 0 \quad (4)$$

[Equation 5]

$$\omega 0 = \frac{1}{\sqrt{(L1+L2+2M)C}} = \frac{1}{\sqrt{2LC}} \quad (5)$$

[Equation 6]

$$Q = \frac{\omega 0 (L1+L2+2M)}{r1+r2} = \frac{2\omega 0 L}{r} \quad (6)$$

Next, resonance frequency and Q value of the resonance circuit of the comparison example are obtained. As shown in FIG. 1, the coils of the comparison example have inductance L1' and L2', respectively, and the capacitor has capacitance C'. When no mutual inductance occurs between the coils, M may be zero (M=0) in the equations (5) and (6), such that the resonance frequency ω0' can be expressed by an equation (7) shown below, and the Q value Q can be expressed by an equation (8) shown below.

[Equation 7]

$$\omega 0' = \frac{1}{\sqrt{(L1'+L2')C}} = \frac{1}{\sqrt{L'C'}} \quad (7)$$

[Equation 8]

$$Q' = \frac{\omega 0'(L1'+L2')}{r1'+r2'} = \frac{\omega 0' L'}{r'} \quad (8)$$

In the forgoing equations (5)-(8), if relations ω0=ψo' and Q=Q' are established, it can be assumed that the resonance circuit of the present embodiment is equivalent to the resonance circuit of the comparison example. In this case, the volumes of the windings of the coils in the present embodiment and the comparison example are considered.

In the forgoing equations (5) and (7), when ψ0=ψo', 2LC=L'C' is established. When C=C', L=L'/2. In other words, the inductance of the coils having mutual inductance can be half the inductance of the coils without mutual inductance.

Next, in the forgoing equations (6) and (8), when Q=Q' and L=L'/2, r=r'. In other words, when the coils have the same resistance values, the resonance circuits with the same Q value can be realized.

In view of the above, the following can be said as to the length of wire members of the windings. When the two coils are assumed to generate the same inductance, L1=L2=L/2, and L1'=L2'=L'/2 are established. Then, as L=L'/2, L1=L1'/2 is established. Inductance is proportional to the square of the number of coil turns, and therefore the number of coil turns of the coil L1 equals to 1/√2 the number of coil turns of the coil L1', and the length of the wire member of the coil L1 equals to 1/√2 the length of the wire member of the coil L1'.

Next, the following can be said as to the cross-sectional area of the wire members of the windings. When the two coils are assumed to have the same resistance values, r1=r2=r/2, and r1'=r2'=r'/2 are established. Then, as r=r', r1=r1' is established. The length of the wire member is 1/√2 as described above, the cross-sectional area of the wire member of the coil L1 equals to 1/√2 the cross-sectional area of the wire member of the coil L1'.

Figure 6A:
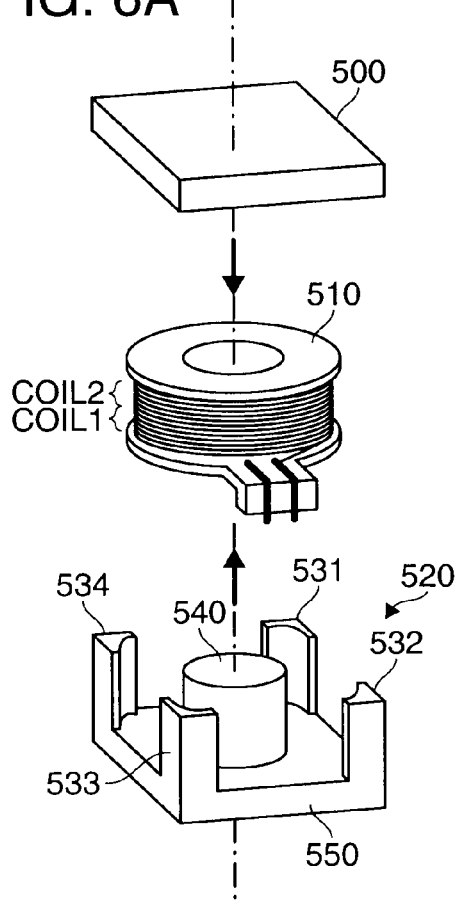
FIGS. 6A-6C show an exemplary structure of a transformer.

As both of the length and the cross-sectional area of the wire member are 1/√2, the volume of the winding of the coil L1 is ½ the volume of the winding of the coil L1'. Similarly, the volume of the winding of the coil L2 is ½ the volume of the winding of the coil L2'. In other words, the volume of the winding of the transformer of the present embodiment can be equal to the volume of one of the coils L1' and L2' of the comparison example. For example, as shown in FIG. 6A and the like, the transformer needs only one ferrite core (a magnetic core), so that the size of the ferrite core may generally be the same as the size of one of the ferrite cores of the comparison example.

In this manner, when the resonance circuit of the present embodiment is formed to be equal to the resonance circuit of the comparison example, the volume of the transformer of the present embodiment can be made generally the same as the volume of one of the coils of the comparison example, and thus its mounting area can be reduced. In general, transformers are used for voltage transformation, and it is generally believed that they may be rarely used as inductors because they have mutual inductance. However, by positively using the mutual inductance of the transformer in the present embodiment, the volume of the coils can be reduced.

It the example described above, the self inductance is L1=L2, and no magnetic flux leakage occurs in mutual inductance. In general, the mutual inductance M and the self inductance L1 and L2 have a relation of $M^2=k^2 L1 \cdot L2$. Here, k is a coupling coefficient of mutual inductance, and is defined as 0≤k≤1. The example above is described as to a case where L1=L2 and k=1 in the equation, and M=L1=L2, and L=L1+L2=2M are established. However, the present embodiment can be implemented, without being limited to k=1, if the coils L1 and L2 generate mutual inductance, and 0<k≤1. In order to obtain the effect in reducing the volume of the transformer described above, k may preferably be k≥0.9. Also, the present embodiment can be implemented, without being limited to L1=L2, and may not require L1=L2. When L1=L2, the power supply voltages VP and VM assume sine waves having the same amplitude. When L1 is not equal to L2, the power supply voltages VP and VM assume sine waves having different amplitudes.

In the comparison example described above, if power regeneration of the adiabatic logic circuit is performed by the resonance circuit formed from two coils and a capacitor, there is a problem in that the two coils need to be mounted on a circuit substrate.

Figure 7:
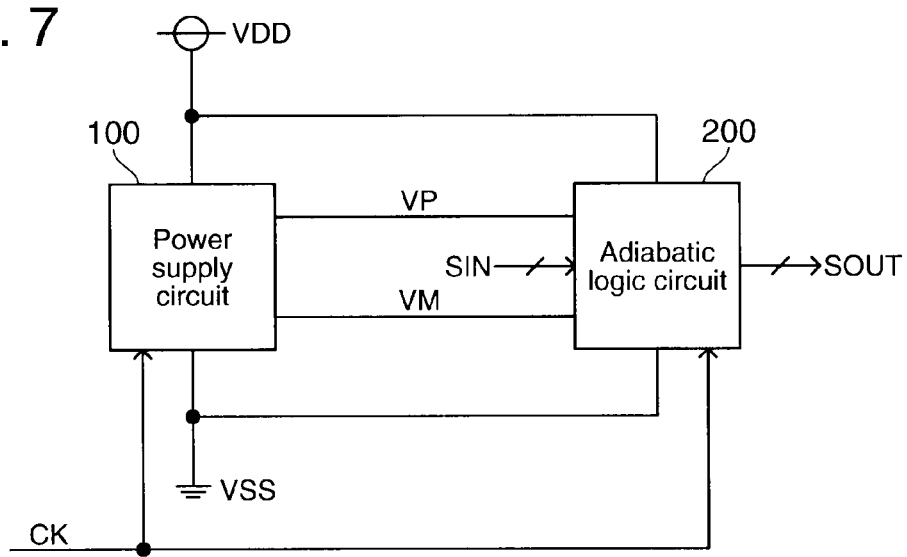
FIG. 7 shows an exemplary structure of a circuit device.

In this respect, the circuit device in accordance with the present embodiment includes a power supply circuit 100 and an adiabatic logic circuit 200 (a logic circuit, in a broad sense), as shown in FIG. 7, etc. The power supply circuit 100 includes a resonance circuit 120, as shown in FIG. 9, etc. As shown in FIG. 3, etc., the resonance circuit 120 includes a first coil L1 and a second coil L2 that share a core section (a magnetic core). Further, the adiabatic logic circuit 200 performs adiabatic logic operation as being provided with the power supply voltages VP and VM generated by the resonance circuit 120.

Therefore, mutual inductance is generated as the coils L1 and L2 share a core, and the mounting area can be reduced through the mutual inductance M. More specifically, as shown in FIG. 3, etc., by providing the primary side of the transformer LT with the coil L1 and the secondary side thereof with the coil L2, the coils L1 and L2 can be realized by a single transformer LT. Also, the volume of the winding of the transformer can be made to be the same as the volume of the winding of one of the coils without mutual inductance, so that the transformer can be mounted substantially in the same area as that for one of the coils of the comparison example.

Furthermore, in accordance with the present embodiment, the resonance circuit has the transformer LT (a coil section, in a broad sense) and the capacitor C. The transformer LT has the first coil L1, the second coil L2 and the core section. The capacitor C is provided between the node NVP on the one end side of the first coil L1 and the node NMV on one end side of the second coil L2.

With such a structure, the two coils L1 and L2 with mutual inductance and the capacitor C can form a resonance circuit. Then, the power supply voltages VP and VM can be outputted from the nodes NVP and NVM, and supplied to the adiabatic logic circuit 200.

Also, in accordance with the present embodiment, the core section has one core. Further, the first coil L1 and the second coil L2 share the one core.

In this manner, as one core is shared by the coils L1 and L2, mutual inductance can be generated between the coils L1 and L2.

It is noted that the present embodiment, the core section is not limited to the case where the core section is formed with one core, but the core section may be formed from a plurality of members. In other words, the fact that the core section is shared by the coils L1 and L2 means that the coils L1 and L2 may substantially share a core. More specifically, the above applies not only to a case where two windings are wound on a core that is formed in one piece and physically share the core, but also to a case where a core section is formed by contacting independently formed cores, thereby forming a magnetic circuit to share the core. For example, as shown in FIG. 6A, etc., the core section may be formed from a core main body section 520 and a core lid section 500.

Also, in accordance with the present embodiment, as shown in FIG. 6A, etc., the core section has a column section 540. The first coil L1 is formed from a first winding COIL 1 wound on the column section 540, and the second coil L2 is formed from a second winding COIL 2 wound on the column section 540.

In doing so, the transformer LT (a coil section) can be formed from the coils L1 and L2. Further, the coils L1 and L2 can be stacked one on top of the other (on the same axis), so that the transformer LT can be formed in a mounting area for one of the coils.

It is noted that the transformer of the present embodiment is not limited to the structure shown in FIG. 6A, but may be formed with windings wound on a core having a different shape. For example, as described above with reference to FIG. 4, the transformer may be formed from two windings wound on a ring-shaped core.

3. Transformer

Figure 6B:
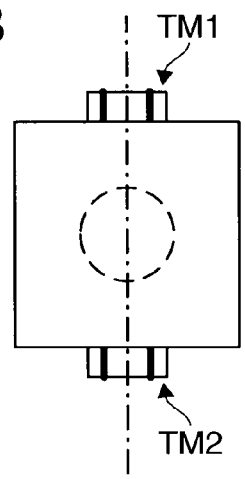
Figure 6C:
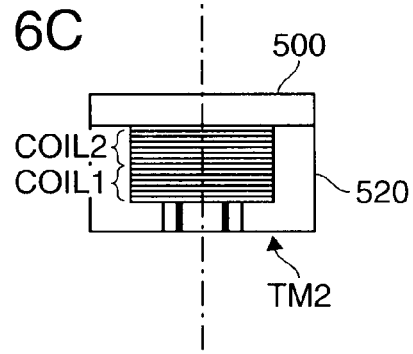

FIGS. 6A-6C show an exemplary structure of a transformer (a coil section) that may be formed with generally the same volume as the volume of one of the coils of the comparison example. FIG. 6A is an exploded view of the transformer, FIG. 6A is a plan view of the transformer, and FIG. 6C is a front view of the transformer.

As shown in FIG. 6A, the transformer in accordance with the present embodiment includes a core lid section 500, a bobbin 510, a core main body section 520, a first winding COIL1 and a second winding COIL2.

The core main body section 520 is formed from first-fourth support sections 531-534, a column section 540, and a bottom section 550. The support sections 531-534 are provided at four corners of the bottom section 550 in a quadrilateral plane shape. The column section 540 is provided in a central section of the bottom section 550 (inside the support sections 531-534), and may be formed, for example, in a columnar shape.

The bobbin 510 is provided for the windings COIL1 and COIL2 to be wound thereon. The bobbin 510 is formed with a shape having an air-core column having ring-shaped plates at its upper surface and bottom surface. For example, the windings COIL1 and COIL2 are each composed of a wire material having the same cross sectional area and the same length, densely wound on the bobbin 510, and the winding COIL2 is wound on the upper side of the winding COIL1. When the coils are mounted on a circuit substrate, the upper side is in a direction away from the circuit substrate.

The core lid section 500 is formed in a quadrilateral plate shape. The core lid section 500 and the core main body section are made of magnetic material such as ferrite or the like, and a core section (a magnetic core) of the transformer is formed by assembling the core lid section 500 and the core main body section.

As shown in FIG. 6B and FIG. 6C, the transformer, when assembled, has a terminal TM1 of the winding COIL1 and a terminal TM2 of the winding COIL2 exposed on side surfaces of the core main body section 520.

4. Circuit Device

FIG. 7 shows an exemplary structure of a circuit device in accordance with an embodiment of the invention to which the resonance circuit described above is applied. The circuit device includes a power supply circuit 100, and an adiabatic logic circuit 200 (an adiabatic circuit: a logic circuit in a broad sense). It is noted that the present embodiment is not limited to the exemplary structure described herein, and various modifications, such as, omission of a portion of the components, addition of other components and the like can be implemented.

The power supply circuit 100 supplies a first power supply voltage VP (a first power supply clock, a high voltage side power supply voltage) and a second power supply voltage VM (a second power supply clock, a low voltage side power supply voltage) to the adiabatic logic circuit. The power supply voltages VP and VM are provided for the adiabatic logic circuit to perform adiabatic logic operation (adiabatic operation), and are voltages that change with time.

More specifically, the power supply voltages VP and VM are voltages that periodically change with different reference voltages as reference, and are generated by a resonance circuit (for example, an LC resonance circuit). For example, the power supply circuit 100 generates power supply voltages VP and VM with a frequency based on the clock CK (for example, the same frequency as CK). The clock CK is inputted from a control circuit or the like not shown. Alternatively, the power supply circuit 100 may include a clock generation circuit not shown, and the clock generation circuit may supply the clock CK. When a self-excited oscillator circuit generates power supply voltages VP and VM, the self-excited oscillator circuit may generate the clock CK. For example, the clock CK may be used for a pulse generation circuit VGF to be described below with reference to FIG. 15 and other figures.

The adiabatic logic circuit 200 performs adiabatic logic operation upon receiving the power supply voltages VP and VM from the power supply circuit 100. More specifically, the adiabatic logic circuit 200 uses a power supply voltage that changes with a period (inclination) sufficiently longer than a time constant determined by the on-resistance and the load capacitance of transistors of the logic circuit, thereby performing adiabatic charge-discharge for controlling heat loses in the logic circuit. Also, the adiabatic logic circuit 200 may achieve lower power consumption by regenerating charges that are charged or discharged in the load capacitance (for example, the gate capacitance and the wiring capacitance) of the logic circuit by a power supply circuit that is capable of storing and regenerating electrical power.

More specifically, an input signal that is synchronous with the power supply voltages VP and VM is inputted in the logic circuit of the adiabatic logic circuit 200. For example, a signal that is synchronous with the clock CK described above is inputted in the adiabatic logic circuit 200. The frequency of the input signal may be the same frequency of the clock CK, or a frequency equivalent to 1 over an integer of the frequency of the clock CK, for example, a frequency in the range between 1 MHz and 10 kHz.

For example, the adiabatic logic circuit 200 is formed from logic gates, such as, inverters, NAND circuits, NOR circuits and the like (i.e., a combinational logic circuit). Also, the adiabatic logic circuit 200 may include holding circuits (memory circuits), such as, a flip-flop circuit, a latch circuit and the like. Further, a sequential circuit may be formed therein with logic gates and holding circuits. It is noted that the adiabatic logic circuit 200 may be formed only from a circuit that performs adiabatic logic operation, or may be formed from a circuit that performs adiabatic logic operation mixed with a circuit that performs non-adiabatic logic operation (ordinary logic circuit operation, CMOS circuit operation).

5. Adiabatic Logic Circuit, Power Supply Circuit

Figure 8:
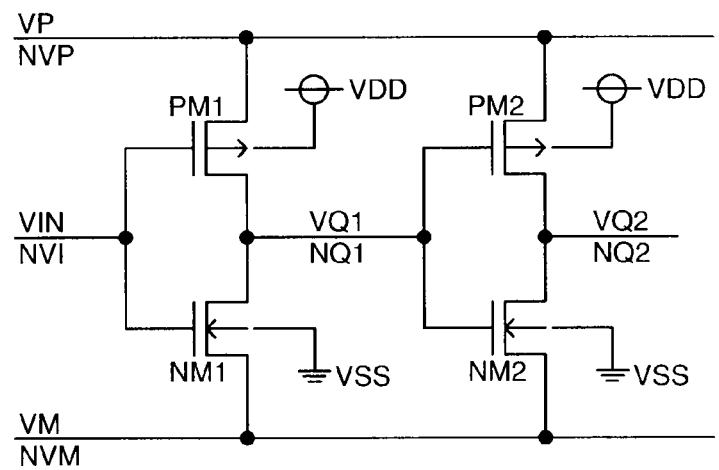
FIG. 8 is a detailed exemplary structure of an adiabatic logic circuit.

Referring to FIGS. 8-10, the above-described exemplary structures of the power supply circuit 100 and the adiabatic logic circuit 200 will be described in greater detail.

FIG. 8 shows a detailed exemplary structure of the adiabatic logic circuit 200. The exemplary structure includes PMOS transistors PM1 and PM2 (first conductivity type transistors in a broad sense) and NMOS transistors NM1 and NM2 (second conductivity type transistors in a broad sense). In the following description, among logic circuits that can be included in the adiabatic logic circuit 200, inverters in two stages are described as an example. However, in accordance with the present embodiment, the adiabatic logic circuit 200 may include other logic circuits.

Specifically, the transistors PM1 and NM1 form an inverter in the preceding stage, and the transistors PM2 and NM2 form an inverter in the succeeding stage. In other words, source terminals of the transistors PM1 and PM2 are connected to a first power supply node NVP, and source terminals of the transistors NM1 and NM2 are connected to a second power supply node NVM. The transistors PM1 and NM1 have gate terminals connected to an input node NVI, and drain terminals connected to an output node NQ1. The transistors PM2 and NM2 have gate terminals connected to the output node NQ1, and drain terminals connected to an output node NQ2. Power supply voltages VP and VM from the power supply circuit 100 are provided to the power supply nodes NVP and NVM, respectively. An input signal VIN is supplied to the input node NVI.

As shown in FIG. 8, a DC voltage VDD (a first DC voltage) is supplied to wells (or substrates) of the transistors PM1 and PM2, and a ground voltage VSS (a second DC voltage) is supplied to substrates (wells) of the transistors NM1 and NM2. Alternatively, the power supply voltage VP may be supplied to wells (back gates) of the transistors PM1 and PM2, and the power supply voltage VM may be supplied to substrates (back gates) of the transistors NM1 and NM2.

FIG. 9 shows a detailed exemplary structure of the power supply circuit 100. This exemplary structure includes a reference voltage generation circuit 110 and a resonance circuit 120.

The reference voltage generation circuit 110 outputs a first reference voltage VR1 and a second reference voltage VR2 that is different in voltage from the first reference voltage VR1. The reference voltages VR1 and VR2 are voltages that define references for the power supply voltages VP and VM that periodically change. For example, the reference voltage generation circuit 110 may be formed from a charge-pump type voltage generation circuit to be described below. Alternatively, the reference voltage generation circuit 110 may be formed from a driver. The driver may output a high level (VDD) and a low level (VSS) with duties corresponding to the reference voltages VR1 and VR2, respectively, thereby effectively generating the reference voltages VR1 and VR2 (as effective values).

The resonance circuit 120 outputs the first power supply voltage VP and the second power supply voltage VM by resonance of one resonance circuit. More specifically, the power supply voltages VP and VM are voltage waveforms in which sine waves, rectangular waves, trapezoidal waves, triangular waves or the like are periodically repeated, and are line-symmetrical voltage waveforms with a third reference voltage (for example, (VR1+VR2)/2) as reference. The resonance circuit described above with reference to FIG. 3 or a resonance circuit to be described below with reference to FIGS. 11-14 is applied to the resonance circuit 120.

FIG. 10 shows examples of voltage waveforms of the adiabatic circuit operation in accordance with the present embodiment. To simplify the description below, an example in which VR1=¾·VDD, VR2=¼·VDD, VP and VM are sine waves, and the adiabatic logic circuit 200 is formed from inverters in two stages as described above with reference to FIG. 8 will be described.

As indicated by H1 in FIG. 10, a sine wave having an amplitude of ¼·VDD with ¾·VDD as reference (a center voltage) is supplied as the power supply voltage VP. As indicated by H2, a sine wave having an amplitude of ¼·VDD with ¼·VDD as reference is supplied as the power supply voltage VM. The sine wave of the power supply voltage VP and the sine wave of the power supply voltage VM have phases that are mutually shifted by 180° (which are in opposite phases). When a low level (VSS) is inputted as the input voltage VIN as indicated by H3, the power supply voltage VP is outputted as the output voltage VQ1 of the inverter in the preceding stage as indicated by H4, and the power supply voltage VM is outputted as the output voltage VQ2 of the inverter in the succeeding stage as indicated by H5. On the other hand, when a high level (VDD) is inputted as the input voltage VIN as indicated by H6, the power supply voltage VM is outputted as the output voltage VQ1 as indicated by H7, and the power supply voltage VP is outputted as the output voltage VQ2 as indicated by H8.

There are various techniques to be implemented for an adiabatic logic circuit, and some problems may exist depending on the techniques.

For example, according to one of the techniques, a diode is provided on the power supply line of the adiabatic logic circuit for holding an output voltage of the logic circuit. However, this technique entails a problem in that, due to a voltage drop on the diode, the high level of the output voltage would not rise to VDD, and the low level of the output voltage would not drop to VSS.

According to another technique, a switched capacitor circuit is used in the power supply circuit to supply a step-wise power supply voltage to the adiabatic logic circuit. However, as charge returning from the adiabatic logic circuit cannot be completely regenerated, there is a problem in that the power consumption would increase.

In this respect, in accordance with the embodiment of the invention described above, the power supply circuit 100 supplies the first power supply voltage VP and the second power supply voltage VM to the adiabatic logic circuit 200. More specifically, as shown in FIG. 3, etc., the power supply circuit 100 supplies the first power supply voltage VM from the node NVP on one end side of the first coil L1, and the second power supply voltage VM from the node NVM on one end side of the second coil L2 by the resonance circuit 120.

More specifically, the first power supply voltage VP periodically changes with the first reference voltage VR1 as a reference voltage, and the second power supply voltage VM periodically changes with the second reference voltage VR2 as a reference voltage. Further, the power supply circuit 100 repeats a first period T1 in which a voltage difference between the power supply voltages VP and VM becomes smaller and a second period T2 in which the voltage difference becomes greater. As shown in FIG. 10, the period T1 is a period in which the voltage difference between the power supply voltages VP and VM changes from its maximum value (for example, VDD) to its minimum value (for example, 0V). Also, the period T2 is a period in which the voltage difference between the power supply voltages VP and VM changes from its minimum value (for example, 0V) to the maximum value (for example, VDD).

According to the present embodiment, as the power supply voltages VP and VM that repeat the first period in which the voltage difference becomes smaller and the second period in which the voltage difference becomes greater are supplied, the adiabatic circuit operation of the adiabatic logic circuit can be realized. Also, as the power supply voltages VP and VM are supplied through resonance, power regeneration by the power supply circuit can be achieved.

It is noted that, in accordance with the present embodiment, the first reference voltage VR1 and the second reference voltage VR2 are mutually different reference voltages.

In doing so, diodes (active elements) at the power supply nodes of the adiabatic logic circuit can be omitted. In other words, because the power supply voltages respectively with the reference voltage VR1 and VR2 as reference are outputted at the output nodes of the logic circuit, the output logic levels can be established without diodes.

Further, in accordance with the present embodiment, as shown in FIG. 10, the second power supply voltage VM assumes the maximum value H13, during a period (for example, T3) between the first maximum value H11 of the first power supply voltage VP and the second maximum value H12 following the first maximum value H11. Then, the second power supply voltage VM assumes the minimum value H16, during a period (for example, T4) between the first minimum value H14 of the first power supply voltage VP and the second minimum value following the first minimum value H14.

Accordingly, the voltage difference between the power supply voltages VP and VM becomes smaller in the period T1 (for example, the period from H11 to H14), and the voltage difference between the power supply voltages VP and VM becomes greater during the period T2 (for example, the period from H14 to H12).

Also, in accordance with the present embodiment, an input signal SIN having an edge is inputted in the adiabatic logic circuit 200 during the second period T2.

In doing so, an edge is not inputted in the charge recovery period (for example, T1 shown in FIG. 10), so that the power loss can be made smaller.

More specifically, an input signal having an edge is inputted in the adiabatic logic circuit 200 at the timing when the voltage difference between the first power supply voltage VP and the second power supply voltage VM becomes to be the smallest.

In doing so, the output voltage does not change when the logic level of the input signal changes, such that adiabatic circuit operation of the adiabatic logic circuit can be realized. For example, as indicated by H9 in FIG. 10, at the timing when the voltage difference between the power supply voltages VP and VM becomes to be the smallest (VP=VM=VDD/2), the input voltage VIA changes as indicated by H10. For this reason, as indicated by H11, the voltage on the output node NQ1 smoothly changes, such that the logic circuit can adiabatically operates.

In accordance with the present embodiment, an input signal having an edge may be inputted in the adiabatic logic circuit 200 in a period in which the minimum voltage difference between the power supply voltages VP and VM is smaller than a predetermined voltage (for example, VR1−VR2).

6. Detailed Exemplary Structure of Resonance Circuit

FIGS. 11-14 show detailed exemplary structures of resonance circuits formed with a transformer and a capacitor.

Figure 11:
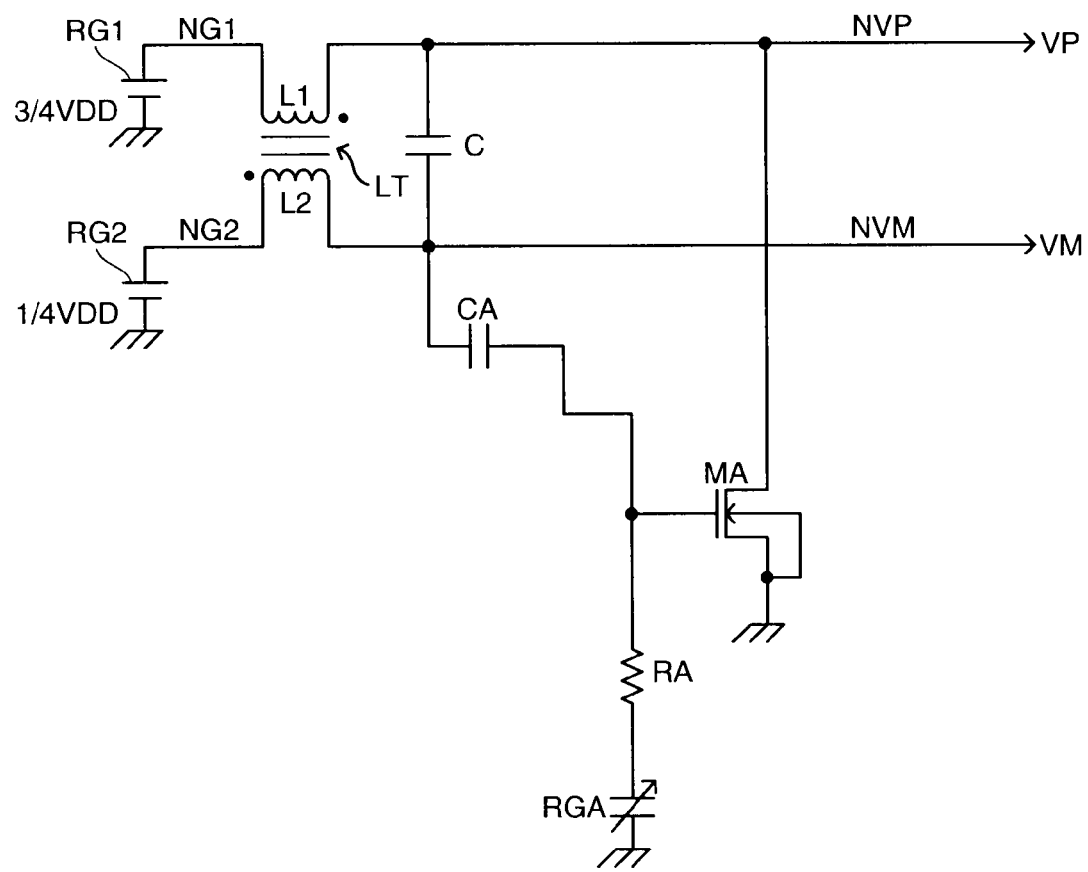
FIG. 11 shows a first detailed exemplary structure of a resonance circuit.

FIG. 11 shows a first detailed exemplary structure of the resonance circuit. The resonance circuit includes a first reference voltage generation circuit RG1, a second reference voltage generation circuit RG2, a transformer LT, a capacitor C, an N-type transistor MA (a first conductivity type transistor in a broad sense), a capacitor CA, a resistance element RA, and a bias voltage generation circuit RGA. In the following description, the same components as those described with reference to FIG. 3 and other figures will be appended with the same reference numbers, and their description may be omitted if appropriate.

The transistor MA, the capacitor CA, the resistance element RA and the bias voltage generation circuit RGA perform excitation control and oscillation amplitude control of the resonance circuit. More specifically, as the bias voltage generation circuit RGA changes the output voltage from a voltage higher than the threshold value to a lower voltage, mutual conductance gm of the transistor MA changes from a larger value to a smaller value. Then, the voltage of the bias voltage generation circuit RGA is controlled to apply an appropriate feedback to the gate voltage of the transistor MA by the transformer LT, the capacitor CA and the resistance element RA, thereby oscillation continuation.

Figure 12:
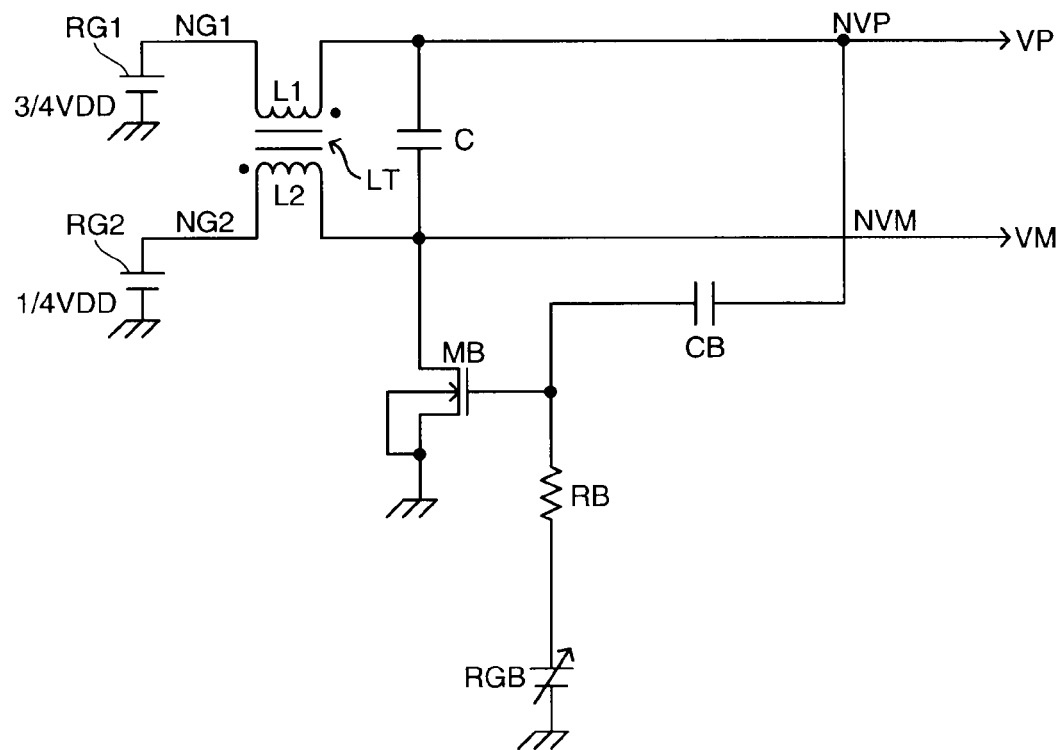
FIG. 12 shows a second detailed exemplary structure of a resonance circuit.

FIG. 12 shows a second detailed exemplary structure of the resonance circuit. The resonance circuit includes a first reference voltage generation circuit RG1, a second reference voltage generation circuit RG2, a transformer LT, a capacitor C, an N-type transistor MB, a capacitor CB, a resistance element RB, and a bias voltage generation circuit RGB.

Like the first exemplary structure, the transistor MB, the capacitor CB, the resistance element RB and the bias voltage generation circuit RGB perform excitation control and oscillation amplitude control of the resonance circuit. The second detailed exemplary structure is different from the first detailed exemplary structure in that the coil L2 on the second output voltage VM side whose reference voltage is ¼·VDD is driven.

Figure 13:
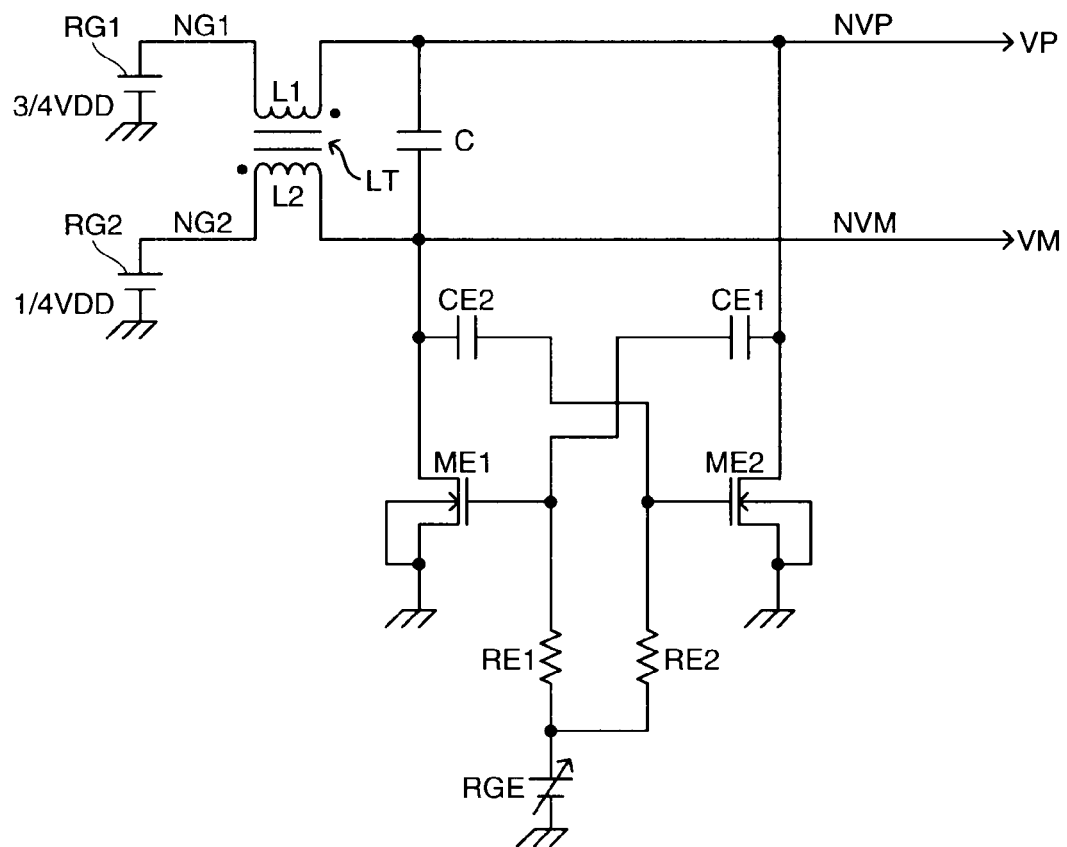
FIG. 13 shows a third detailed exemplary structure of a resonance circuit.

FIG. 13 shows a third detailed exemplary structure of the resonance circuit. The resonance circuit includes a first reference voltage generation circuit RG1, a second reference voltage generation circuit RG2, a transformer LT, a capacitor C, first and second N-type transistors ME1 and ME2, first and second capacitors CE1 and CE2, first and second resistance elements RE1 and RE2, and a bias voltage generation circuit RGB.

The transistors ME1 and ME2, the capacitors CE1 and CE2, the resistance elements RE1 and RE2, and the bias voltage generation circuit RGE form a multivibrator, and cause self-excited oscillation. More specifically, feedback by the transistor ME1, the capacitor CE1 and the resistance element RE1, and feedback by the transistor ME2, the capacitor CE2 and the resistance element RE2 are cross-coupled. Then, the transistors MR1 and ME2 alternately drive the drain current, thereby causing oscillation.

Figure 14:
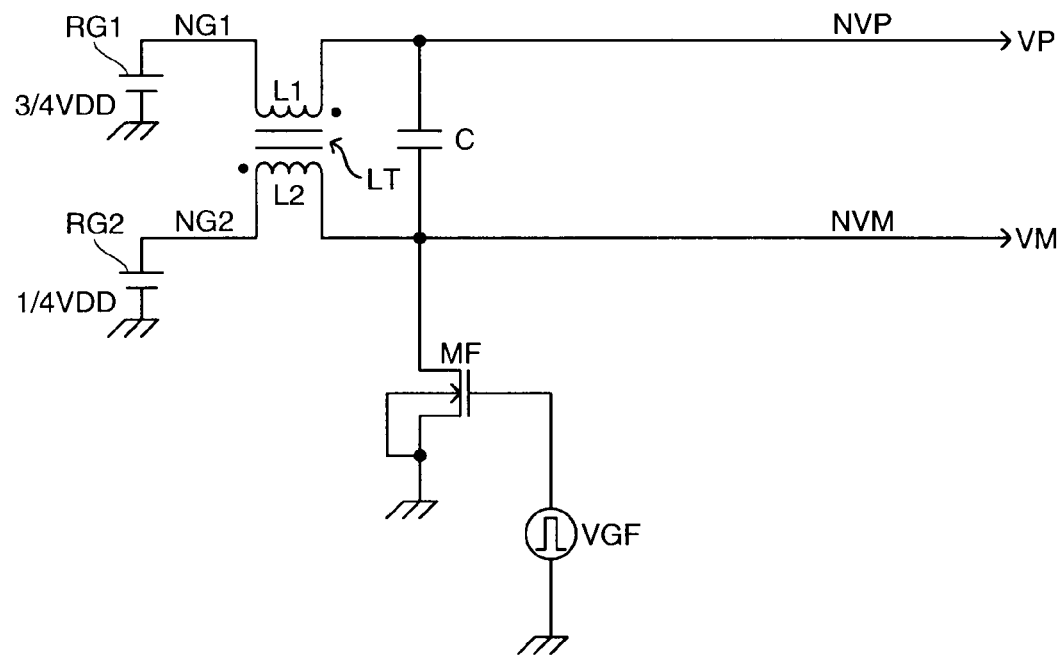
FIG. 14 shows a fourth detailed exemplary structure of a resonance circuit.

FIG. 14 shows a fourth detailed exemplary structure of the resonance circuit. The resonance circuit includes a first reference voltage generation circuit RG1, a second reference voltage generation circuit RG2, a transformer LT, a capacitor C, an N-type transistor MF, and a pulse voltage generation circuit VGF.

Figure 15A:
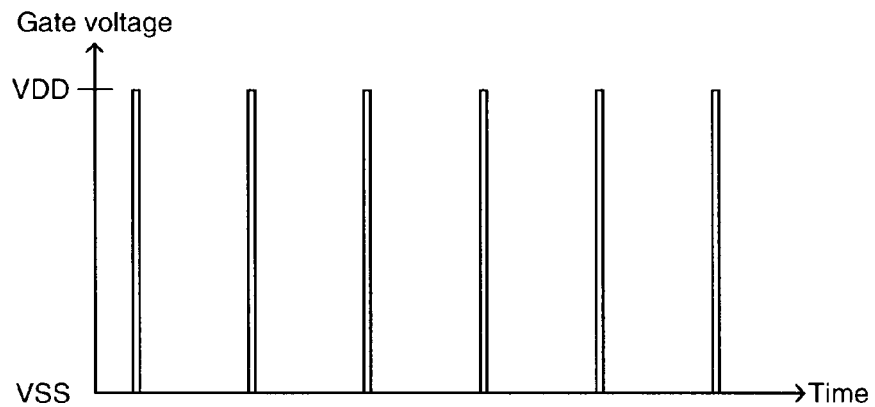
FIGS. 15A-15C show examples of voltage waveforms and current waveforms for oscillation control.
Figure 15B:
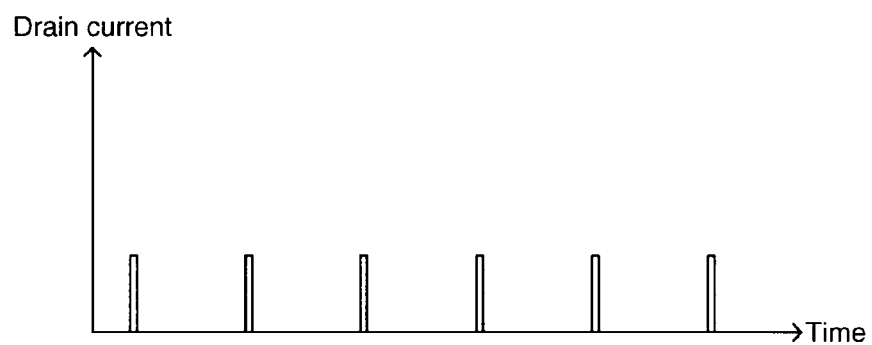

According to the fourth detailed exemplary structure, the transistor MF and the pulse voltage generation circuit VGF perform excitation control, oscillation continuation control, and oscillation amplitude control. More specifically, as shown in FIG. 15A, the pulse voltage generation circuit VGF outputs a pulse voltage with the same period as the resonance period of the resonance circuit. As shown in FIG. 15B, the transistor MF receives the pulse voltage, and outputs a drain current in pulses, thereby driving the coil L2. Then, as shown in FIG. 15C, output voltages VP and VM in sine wave are outputted.

At the time of oscillation continuation, power loss at the power supply circuit 100 and the adiabatic logic circuit 200 is compensated by the pulse-like drain current described above. In other words, as the pulse voltage, a voltage having a pulse width necessary to compensate power loss at the power supply circuit 100 and the adiabatic logic circuit 200 is supplied. At the time of starting oscillation, for example, a pulse voltage having a greater width than the pulse width at the time of oscillation continuation is supplied.

Figure 15C:
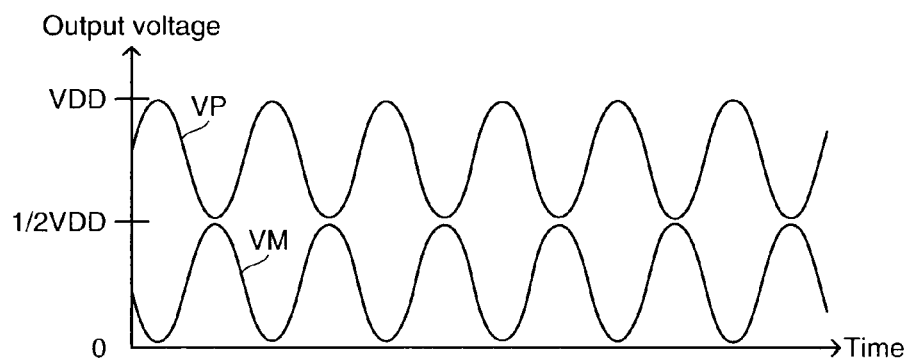

Referring to FIGS. 15A-15C, the case in which the period of the pulse voltage is the same as the resonance period of the resonance circuit is described. However, according to the present embodiment, the period of the pulse voltage may be an integer multiple of 2 or more of the resonance period of the resonance circuit.

In the embodiments described above, a transistor for oscillation continuation (for example, MB shown in FIG. 12, and MF shown in FIG. 14) is provided at the node on one end side of the second coil L2.

In doing so, the transistor for oscillation continuation drives the coil L2 by its drain current, such that the control for continuing oscillation of the resonance circuit can be performed.

Also, in accordance with the present embodiment, the first reference voltage VR1=¾·VDD is supplied to the node NG1 on the other end side of the first coil L1, and the second reference voltage VR2=¼·VDD is supplied to the node NG2 on the other end side of the second coil L2. The second reference voltage VR2 is a voltage lower than the first reference voltage VR1.

In doing so, the amplitude control of the output voltages VP and VM can be facilitated. In other words, when the transistor for oscillation continuation is provided on the first reference voltage VR1 side, there is a possibility that the output voltage VP lowers the lower limit voltage VDD/2 when the transistor for oscillation continuation turns on. On the other hand, when the transistor for oscillation continuation is provided on the second reference voltage VR2 side, the outputvoltage VM does not lower the lower limit voltage VSS even when the transistor for oscillation continuation turns on, such that the oscillation amplitude can be more readily controlled.

Also, in accordance with the present embodiment, as shown in FIG. 14, etc., a pulse voltage with a period that is n times (n is an integer of 1 or more) the period of the power supply voltage VP and VM is inputted in the gate electrode of the transistor MF for oscillation continuation.

In doing so, a drain current in pulses flows through the transistor MF for oscillation continuation, and the coil L2 is driven by the drain current, whereby oscillation continuation can be controlled. Also, as the pulse voltage is applied to the gate electrode, the transistor MF performs switching operation. By this, an intermediate voltage is applied to the gate electrode by a feedback circuit or the like, such that the power consumption in oscillation control can be suppressed better, compared to the case of analog oscillation control.

It is noted that the pulse voltage (or the pulse current) defines a rectangular or a spike like voltage waveform (a current waveform), and may be a voltage waveform with a duty at high level being less than 0.5 in the case of high-active. At the time of oscillation continuation, a pulse width for compensating for power losses is sufficient, such that a voltage waveform with much smaller duty can be used. For example, a voltage waveform with a duty being 0.1 or smaller may be used.

7. Reference Voltage Generation Circuit

Figure 16:
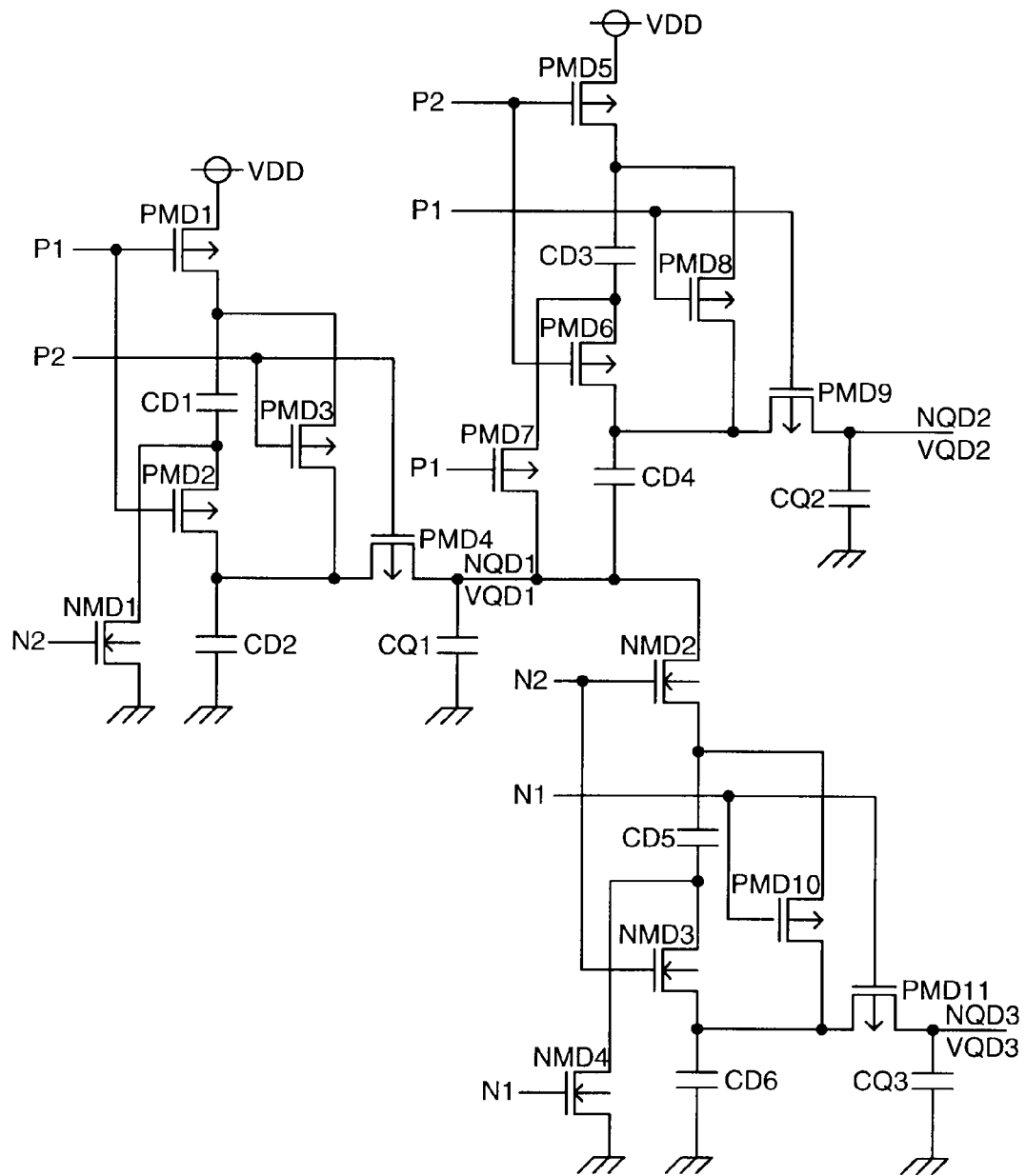
FIG. 16 is a detailed exemplary structure of a reference voltage generation circuit.

FIG. 16 shows a detailed exemplary structure of a charge pump type reference voltage generation circuit that outputs reference voltages VR1=¾·VDD and VR2=¼·VDD. This exemplary structure includes PMOS transistors PMD1-PMD11 (first conductivity type transistors in a broad sense), NMOS transistors NMD1-NMD4 (second conductivity type transistors in a broad sense), and capacitors CD1-CD6 and CQ1-CQ3. Hereinbelow, to simplify the description, an example in which the capacitors have capacitance values of CD1=CD2, CD3=CD4 and CD5=CD6 will be described.

The reference voltage generation circuit receives clocks P1, P2, N1 and N2 supplied from an unshown control circuit or the like. The clocks P1 and P2 are clocks with opposite phases (inverted logic levels). Also, the clocks N1 and N2 are clocks that are, for example, the same as the clocks P2 and P2.

When the clock P1 is at low level, the transistors PMD1 and PMD2 are turned on, and the transistors PMD3, PMD4 and NMD1 are turned off. In this instance, the capacitors CD1 and CD2 are charged between VDD and VSS. When the clock P1 is at high level, PMD1 and PMD2 are turned off, PMD3, PMD4 and NMD1 are turned on, and the charge is distributed among the capacitors CD1, CD2 and CQ1. Then, a voltage VQD1=½·VDD is outputted to the node NQD1.

Similarly, the capacitors CD3 and CD4 are charged between VDD and ½·VDD, and the charge is distributed among the capacitors CD3, CD4 and CQ2, such that a reference voltage VQD 2=¾·VDD is outputted to the node NQD2. Also, the capacitors CD5 and CD 6 are charged between ½·VDD and VSS, and the charge is distributed among the capacitors CD5, CD6 and CQ3, such that a reference voltage VQD3=¼·VDD is outputted to the node NQD3.

8. Electronic Apparatus

Figure 17:
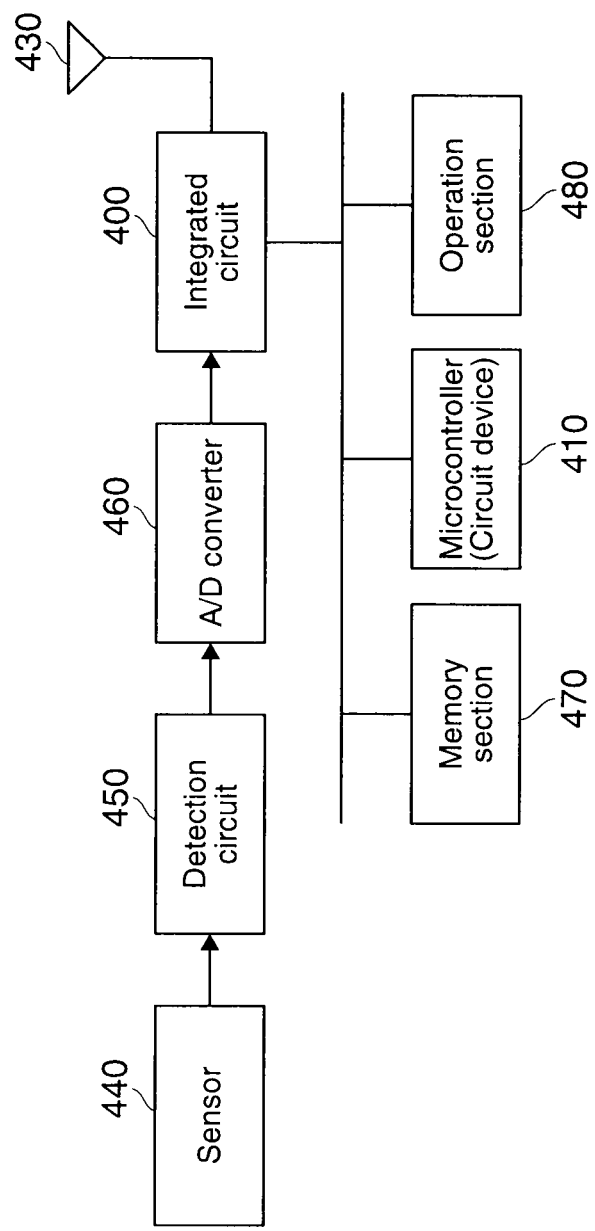
FIG. 17 is an exemplary structure of an electronic apparatus.

FIG. 17 shows an exemplary structure of an electronic apparatus to which the circuit device in accordance with the present embodiment is applicable. The electronic apparatus includes an integrated circuit device 400, a microcontroller 410 (a host, a circuit device), an antenna 430, a sensor 440, a detection circuit 450, an A/D converter 460 (an A/D converter circuit), a memory section 470, and a control section 480. The electronic apparatus in accordance with the present embodiment is applicable to, for example, a thermometer-hygrometer, a heart rate monitor, a pedometer, and the like.

The sensor 440 is formed from a sensor that serves the purpose of the electronic apparatus, for example, a temperature sensor, a humidity sensor, a gyro-sensor, an acceleration sensor, a photo sensor, a pressure sensor and the like. The detection circuit 450 amplifies an output signal (a sensor signal) from the sensor 440, and removes noise by a filter device. The A/D converter 460 converts the amplified signal into a digital signal, and outputs the same to the integrated circuit device 400. The integrated circuit device 400 processes the output signal from the sensor 440, and wire-transmits the processed signal through the antenna 430. The microcontroller 410 includes the power supply circuit in accordance with the exemplary embodiment, and may be formed from an adiabatic logic circuit. The microcontroller 410 performs digital signal processing, and control processing of the electronic apparatus based on set information stored in the memory section 470 and signals from the operation section 480. The microcontroller 410 is a main component for digital processing of the electronic apparatus, and achieve power saving by an adiabatic logic circuit method. The memory section 470 may be formed from, for example, a flash memory, and stores set information and detected data. The operation section 480 may be formed from, for example, key pads or the like, and used by the use for operating the electronic apparatus.

Although some embodiments of the invention have been described in detail above, those skilled in the art would readily appreciate that many modifications are possible in the embodiments without substantively departing from the novel matter and advantages of the invention. Accordingly, such modifications are intended to be included within the scope of the invention. Any term (e.g., transformer, VDD, VSS and the like) cited with a different term (e.g., coil section, first DC voltage, second DC voltage and the like) having a broader meaning or the same meaning at least once in the specification and the drawings may be replaced by the different term in any place in the specification and the drawings. The structures and the operations of the resonance circuit, the power supply circuit, the adiabatic logic circuit, the circuit device, the electronic apparatus and the like are not limited to those described with reference to the above embodiments, and various modifications and variations may be made.

What is claimed is:

1. A circuit device comprising:
   a power supply circuit having a resonance circuit; and
   a logic circuit,
   the resonance circuit including a first coil, and a second coil having a core section shared by the first coil,
   the logic circuit performing an adiabatic circuit operation with a power supply voltage generated by the resonance circuit,
   the power supply circuit supplies a first power supply voltage from a node on one end side of the first coil and a second power supply voltage from a node on one end side of the second coil to the logic circuit as the power supply voltage,
   the first power supply voltage periodically changes with a first reference voltage as a reference voltage,
   the second power supply voltage periodically changes with a second reference voltage as a reference voltage, and
   the first and second reference voltages are mutually different reference voltages.

2. A circuit device according to claim 1, wherein
   the core section has a columnar section,
   the first coil is formed from a first winding wound on the columnar section, and
   the second coil is formed from a second winding wound on the columnar section.

3. A circuit device according to claim 1, wherein
   the resonance circuit includes a coil section having the first coil, the second coil and the core section, and
   a capacitor provided between the node on the one end side of the first coil and the node on the one end side of the second coil.

4. A circuit device according to claim 1, wherein
   the core section has one core, and
   the first coil and the second coil shares the one core.

5. A circuit device according to claim 1, wherein
   the power supply circuit supplies, by the resonance circuit, the first power supply voltage and the second power supply voltage that repeat a first period in which a voltage difference between the first power supply voltage and the second power supply voltage becomes smaller and a second period in which the voltage difference becomes greater.

6. A circuit device according to claim 1, wherein
   the first power supply voltage and the second power supply voltage repeat a first period in which a voltage difference between the first power supply voltage and the second power supply voltage becomes smaller and a second period in which the voltage difference becomes greater, and
   the second power supply voltage assumes a maximum value in a period between a first maximum value of the first power supply voltage and a second maximum value succeeding the first maximum value, and assumes a minimum value in a period between a first minimum value of the first power supply voltage and a second minimum value succeeding the first minimum value.

7. A circuit device according to claim 5, wherein
   an input signal having an edge in the second period is inputted in the logic circuit.

8. A circuit device according to claim 1, wherein
the first power supply voltage provided by the power supply circuit is a sine wave with the first reference voltage as a reference voltage, and
the second power supply voltage provided by the power supply circuit is a sine wave with an inverted phase with respect to the first power supply voltage with the second reference voltage as a reference voltage.

9. A circuit device according to claim 1, further comprising:
a transistor for oscillation continuation provided at the node on the one side of the first coil or the node on the one end side of the second coil.

10. A circuit device comprising:
a power supply circuit having a resonance circuit; and
a logic circuit,
the resonance circuit including a first coil, and a second coil having a core section shared by the first coil,
the power supply circuit supplying a first power supply voltage from a node on one end side of the first coil and a second power supply voltage from a node on one end side of the second coil to the logic circuit as the power supply voltage,
a first reference voltage being supplied to a node on the other end side of the first coil,
a second reference voltage being supplied to a node on the other end side of the second coil,
the second reference voltage being lower than the first reference voltage, and
the logic circuit performing an adiabatic circuit operation with the first power supply voltage and the second power supply voltage being supplied.

11. A circuit device according to claim 9, wherein
a pulse voltage with a period that is n times (n is an integer of 1 or more) a period of the first power supply voltage and the second power supply voltage is inputted in a gate electrode of the transistor for oscillation continuation.

12. An electronic apparatus comprising the circuit device recited in claim 1.

13. A power supply circuit comprising:
a resonance circuit having a coil section and a capacitor,
the coil section including a first coil, and a second coil having a core that is shared by the first coil,
the coil section including a first coil, and a second coil having a core section shared by the first coil,
the resonance circuit supplying a first power supply voltage from a node on one end side of the first coil and a second power supply voltage from a node on one end side of the second coil,
a first reference voltage being supplied to a node on the other side of the first coil, and a second reference voltage being supplied to a node on the other side of the second coil, the second reference voltage being lower than the first reference voltage, and
the resonance circuit being thus configured to supply a first power supply voltage and the second power supply voltage to an adiabatic circuit by resonance generated by the coil section and the capacitor.

14. A circuit device according to claim 10, further comprising:
a transistor for oscillation continuation provided at the node on the one end side of the first coil or the node on the one end side of the second coil.

15. An electronic apparatus comprising the circuit device recited in claim 10.

* * * * *